United States Patent
Ren et al.

(10) Patent No.: US 7,586,347 B1
(45) Date of Patent: Sep. 8, 2009

(54) CLOCK GENERATOR WITH SELF-BIAS BANDWIDTH CONTROL

(75) Inventors: Chenxiao Ren, Shanghai (CN); Zhongyuan Chang, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/862,653

(22) Filed: Sep. 27, 2007

(51) Int. Cl.
  *H03L 7/06* (2006.01)
(52) U.S. Cl. .................................. 327/157; 327/148
(58) Field of Classification Search ........................ None
  See application file for complete search history.

(56) References Cited

U.S. PATENT DOCUMENTS

| | | | |
|---|---|---|---|
| 4,952,887 A | 8/1990 | Ashley | |
| 5,629,650 A * | 5/1997 | Gersbach et al. | 331/17 |
| 5,933,037 A * | 8/1999 | Momtaz | 327/157 |
| 5,963,102 A | 10/1999 | Pang | |
| 6,624,668 B1 | 9/2003 | Robinson et al. | |
| 6,853,252 B2 | 2/2005 | Dickmann | |
| 6,989,718 B2 * | 1/2006 | Pretl et al. | 331/16 |
| 6,998,890 B2 | 2/2006 | Chen | |
| 7,023,250 B2 | 4/2006 | Chen | |
| 7,030,688 B2 * | 4/2006 | Dosho et al. | 327/558 |
| 7,148,757 B2 * | 12/2006 | Chiu | 331/16 |
| 7,239,188 B1 * | 7/2007 | Xu et al. | 327/156 |
| 7,327,195 B2 * | 2/2008 | Sawada | 331/16 |
| 7,372,339 B2 * | 5/2008 | Fu | 331/16 |
| 2002/0097825 A1 * | 7/2002 | Kawahara | 375/376 |
| 2007/0200603 A1 * | 8/2007 | Shi et al. | 327/156 |

OTHER PUBLICATIONS

John G. Maneatis, "Low-Jitter Process-Independent DLL and PLL Based on Self-Biased Techniques," IEEE Journal of solid-State Circuits, vol. 31, No. 11, Nov. 1996.

Gang Yan, Chenxiao Ren, Zhendong Guo, Qing Ouyang, Shendong Guo, Qing Ouyang, Zhongyuan Chang, "A self-biased PLL with current-mode filter for clock generation" ISSCC 2005/Session 22/ PLL, DLL and VCOs/ 22.6.

* cited by examiner

*Primary Examiner*—Cassandra Cox
(74) *Attorney, Agent, or Firm*—Stanley J. Pawlik; Kenneth Glass; Glass & Associates (57) ABSTRACT

A clock generator includes a phase-lock loop for generating an output clock signal based on a reference clock signal. The phase-lock loop includes a charge pump, a low-pass filter, and a self-bias circuit. The low-pass filter generates a bias voltage and the self-bias circuit generates a charge current based on the bias voltage. The charge pump generates an output based on the charge current to maintain a constant open-loop bandwidth of the phase-lock loop.

18 Claims, 6 Drawing Sheets

CLOCK GENERATOR WITH SELF-BIAS BANDWIDTH CONTROL

BACKGROUND

A clock generator often includes a phase-lock loop that generates an output clock signal based on reference clock signal. In operation, the phase-lock loop generates a feedback clock signal by dividing a frequency of the output clock signal and locks a phase and frequency of the feedback clock signal to a phase and frequency of the reference clock signal.

One characteristic of a phase-lock loop is an open-loop unity-gain. In conventional phase-lock loops, the open-loop unity-gain depends upon the reference clock signal and a divisor of a frequency divider. Additionally, the open-loop unity-gain of the phase-lock loop may depend upon variations in performance characteristics of components in the phase-lock loop. For example, an open-loop unity-gain of a phase-lock loop implemented in an integrated circuit may vary over process, voltage, and temperature variations in the integrated circuit. Because the open-loop unity-gain of the phase-lock loop depends upon the divisor of the frequency divider as well as variations in performance characteristics of component in the phase-lock loop, an open-loop unity-gain bandwidth of the phase-lock loop may not be within a specified frequency range. This can result in reduced production yield of the integrated circuit device and increased production cost of the integrated circuit device.

In light of the above, a need exists for a phase-lock loop having a controllable open-loop unity-gain. A further need exists for a phase-lock loop that compensates for process, voltage, and temperature variations in an integrated circuit including the phase-lock loop to maintain a substantially constant open-loop unity-gain of the phase-lock loop.

SUMMARY

In various embodiments, clock generator includes a phase-lock loop for generating an output clock signal based on a reference clock signal. The phase-lock loop includes a charge pump, a low-pass filter, and a self-bias circuit. The low-pass filter generates a bias voltage and the self-bias circuit generates a charge current based on the bias voltage. The charge pump generates a signal based on the charge current to maintain a substantially constant open-loop unity-gain of the phase-lock loop. Moreover, the self-bias circuit may compensate for process, voltage, and temperature variation in an integrated circuit including the phase-lock loop. Because the self-bias circuit maintains a substantially constant open-loop unity-gain of the phase-lock loop, the open-loop unity-gain bandwidth of the phase-lock loop is also substantially constant, which reduces cost and increases yield in production of the integrated circuit.

A clock generator, in accordance with one embodiment, includes a phase-lock loop configured to generate an output clock signal based on a reference clock signal. The phase-lock loop includes a charge pump, a low-pass filter, a voltage-controlled oscillator, and a self-bias circuit. The charge pump is configured to generate a first signal for adjusting a frequency of the phase-lock loop based on a charge current. The low-pass filter is configured to generate a second signal and a bias voltage by filtering the first signal. The voltage-controlled oscillator is configured to generate the output clock signal based on the second signal. The self-bias circuit is configured to generate the charge current based on the bias voltage for controlling a bandwidth of the phase-lock loop.

An integrated circuit, in accordance with one embodiment, includes a phase-frequency detector, a charge pump, a low-pass filter, a self-bias circuit, a voltage-controlled oscillator, and a frequency divider. The phase-frequency detector is configured to generate a first signal indicating a phase difference between a reference clock signal and a feedback clock signal. The charge pump is configured to generate a second signal for adjusting a frequency of the phase-lock loop based on the first signal and a charge current. The low-pass filter is configured to generate a third signal and a bias voltage by filtering the second signal. The self-bias circuit is configured to generate the charge current for controlling a bandwidth of the phase-lock loop based on the bias voltage. The voltage-controlled oscillator is configured to generate an output clock signal based on the third signal. The frequency divider is configured to generate the feedback clock signal by dividing the frequency of the output clock signal.

A method, in accordance with one embodiment, generates a clock signal by using a phase-lock loop. The method includes generating a first signal indicating a phase difference between a reference clock signal and a feedback clock signal. The method also includes generating a second signal for adjusting a frequency of an output clock signal based on the first signal and a charge current. Additionally, the method includes generating a third signal and a bias voltage by low-pass filtering the second signal. The method further includes generating the charge current based on the bias voltage for controlling a bandwidth of the phase-lock loop. Further, the method includes generating the output clock signal based on the third signal and generating the feedback clock signal by dividing the frequency of the output clock signal.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

In various embodiments, a clock generator includes a phase-lock loop for generating an output clock signal based on a reference clock signal. The phase-lock loop includes a self-bias circuit for maintaining a substantially constant open-loop unity-gain bandwidth of the phase-lock loop.

Figure 1:
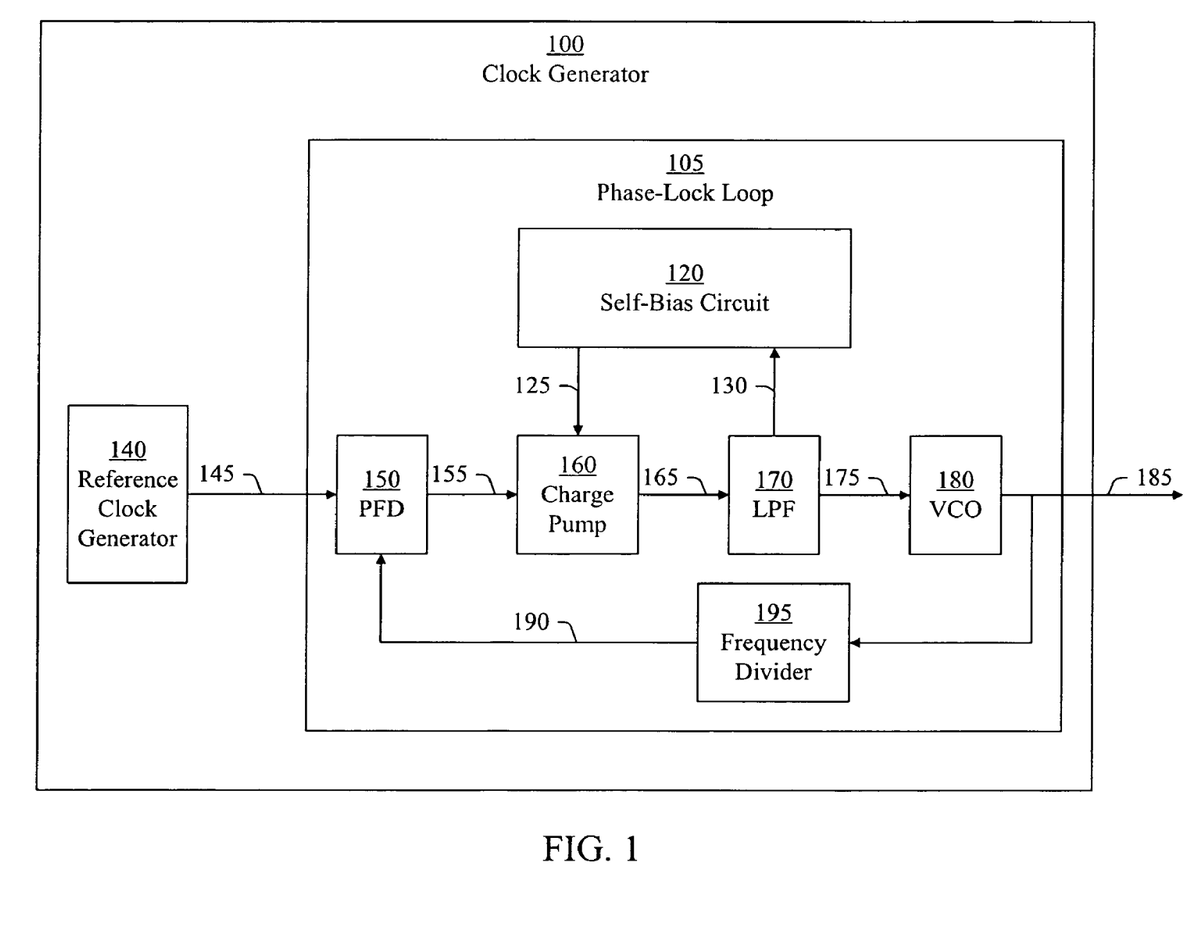
FIG. 1 is a block diagram of a clock generator, in accordance with an embodiment of the present invention.

FIG. 1 illustrates a clock generator 100, in accordance with an embodiment of the present invention. The clock generator 100 includes a phase-lock loop 105 and a reference clock generator 140 coupled to the phase-lock loop 105. The reference clock generator 140 generates a reference clock signal 145 and the phase-lock loop 105 generates an output clock signal 185 based on the reference clock signal 145.

The phase-lock loop 105 includes a self-bias circuit 120, a phase-frequency detector (PFD) 150, a charge pump 160, a low-pass filter (LPF) 170, a voltage-controlled oscillator (VCO) 180, and a frequency divider 195. The charge pump 160 is coupled to the phase-frequency detector 150, the self-bias circuit 120, and the low-pass filter 170. Additionally, the low-pass filter 170 is coupled to the self-bias circuit 120 and the voltage-controlled oscillator 180. The frequency divider 195 is coupled to the voltage-controlled oscillator 180 and the phase-frequency detector 150.

The self-bias circuit 120 controls an open-loop unit-gain of the phase-lock loop 105. In some embodiments, the phase-lock loop 105 is implemented in an integrated circuit. In these embodiments, the self-bias circuit 120 controls the open-loop unit-gain of the phase-lock loop 105 by compensating for process, voltage, and temperature (PVT) variation in the integrated circuit. By controlling the open-loop unity-gain of the phase-lock loop 105, the self-bias circuit 120 maintains a substantially constant open-loop unity-gain bandwidth of the phase-lock loop 105. In various embodiments, the self-bias circuit 120 controls the open-loop unity-gain of the phase-lock loop 105 such that the open-loop unity-gain bandwidth of the phase-lock loop 105 does not vary by more than ten to twenty percent, depending upon the configuration of the self-bias circuit 120. In this way, the self-bias circuit 120 maintains a substantially constant open-loop unity-gain bandwidth of the phase-lock loop 105.

The phase-frequency detector 150 generates a signal 155 based on the reference clock signal 145 generated by the reference clock generator 140 and a feedback clock signal 190 generated by the frequency divider 195. The signal 155 indicates a phase difference between the reference clock signal 145 and the feedback clock signal 190. For example, the signal 155 may indicate whether a phase of the reference clock signal 145 leads or lags the phase of the feedback clock signal 190.

The charge pump 160 generates a signal 165 for adjusting a frequency of the output clock signal 185 based on the signal 155 and a charge current 125 generated by the self-bias circuit 120. In various embodiments, the phase-frequency detector 150 generates the signal 155 indicating whether the charge current 125 is to be increased or decreased for reducing the phase difference between the reference clock signal 145 and the feedback clock signal 190.

The low-pass filter 170 generates a signal 175 and a bias voltage 130 by filtering out higher frequency components of the signal 165 and passing lower frequency components of the signal 165. The low-pass filter 170 may be any type of electrical circuit that performs low-pass filtering on the signal 165 and generates the bias voltage 130 based on the signal 165. In various embodiments, the signal 175 includes a voltage for determining a frequency of the output clock signal 185.

The voltage-controlled oscillator 180 generates the output clock signal 185 based on signal 175. The frequency divider 195 generates the feedback clock signal 190 by dividing a frequency of the output clock signal 185 by a divisor. In operation, the phase-lock loop 105 locks a phase and frequency of the feedback clock signal 190 to a phase and frequency of the reference clock signal 145.

The self-bias circuit 120 generates the charge current 125 for controlling the open-loop unity-gain of the phase-lock loop 105 based on the bias voltage 130, as is described more fully herein. Generally, the open-loop unity-gain of the phase-lock loop 105 is a product of a gain of the phase-frequency detector 150, a gain of the low-pass filter 170, and a gain of the voltage-controlled oscillator 180 divided by a gain of the frequency divider 195. In operation, the self-bias circuit 120 adjusts the charge current 125 based on the bias voltage 130, and the charge pump 160 adjusts the signal 165 based on the charge current 125. In turn, the low-pass filter 170 adjusts the signal 175, the voltage-controlled oscillator 180 adjusts the output clock signal 185, the frequency divider 195 adjusts the feedback clock signal 190, and the phase-frequency detector 150 adjusts the signal 155. In this way, adjustment of the charge current 125 changes the gains of the phase-frequency detector 150, the low-pass filter 170, the voltage-controlled oscillator 180, and the frequency divider 195.

In various embodiments, the phase-lock loop 105 is embodied in an integrated circuit. In some embodiments, the integrated circuit also includes one or more other electronic circuits, such a logic circuit, an analog circuit, a processor, a memory, or the like. For example, the integrated circuit may include the reference clock generator 140. As is described more fully herein, the self-bias circuit 120 functions to maintain a substantially constant open-loop unity-gain bandwidth of the phase-lock loop 105. In some embodiments, the self-bias circuit 120 maintains a substantially constant open-loop unity-gain bandwidth of the phase-lock loop 105 by compensating for process, voltage, and temperature variation in the integrated circuit containing the phase-lock loop 105, as is also described more fully herein. Because the self-bias circuit 120 maintains a substantially constant open-loop unity-gain bandwidth of the phase-lock loop 105, some or all of the components in the phase-lock loop 105 may have reduced design margins, which reduces product costs of the integrated circuit. Moreover, production yield of the integrated circuit may increase which also reduces production costs of the integrated circuit.

Figure 2:
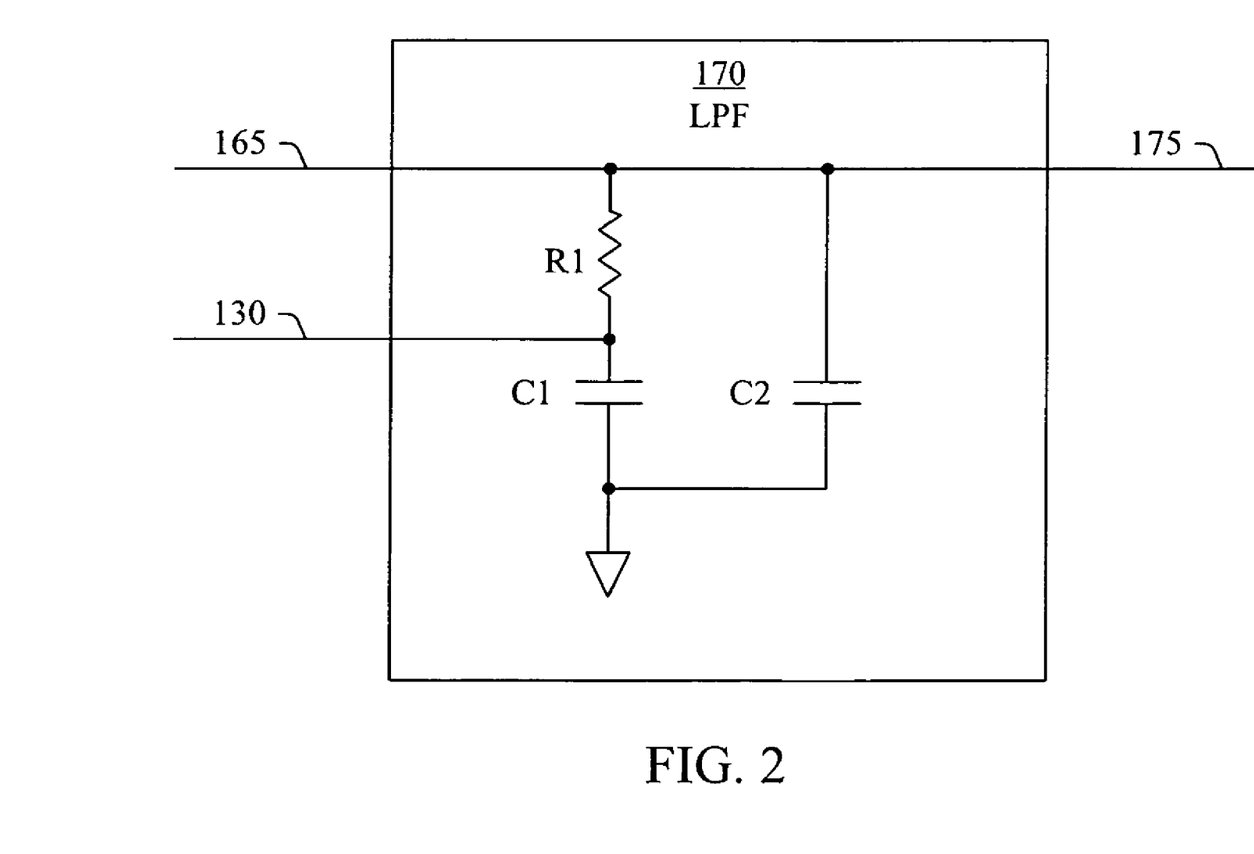
FIG. 2 is a schematic diagram of a low-pass filter, in accordance with an embodiment of the present invention.

FIG. 2 illustrates the low-pass filter 170, in accordance with an embodiment of the present invention. The low-pass filter 170 includes a resistor R1, a capacitor C1, and a capacitor C2. The resistor R1 and the capacitor C1 are connected in series and the capacitor C2 is connected in parallel across the resistor R1 and the capacitor C1. One end of the capacitor C1 and one end of the capacitor C2 are connected to a ground potential. One end of the resistor R1 is connected to the other end of the capacitor C1 at which the bias voltage 130 is generated. In operation, a current flows through the resistor R1 and charges the capacitor C1 to the bias voltage 130. In this way, the capacitor C1 generates the bias voltage 130. The other end of the resistor R1 receives the signal 165 and is connected to the other end of the capacitor C2 at which the signal 175 is generated.

In various embodiments, a capacitance of the capacitor C2 is less than a capacitance of the capacitor C1 to maintain stability in the low-pass filter 170. In some embodiments, the low-pass filter 170 may have more or fewer components than the resistor R1 and the capacitors C1 and C2, which may be connected in various arrangements. For example, the low-pass filter 170 may include an additional capacitor coupled in parallel across the resistor R1 and the capacitor C1 such that one end of the additional capacitor receives the signal 165 and another end of the additional capacitor is connected to a ground potential.

Figure 3:
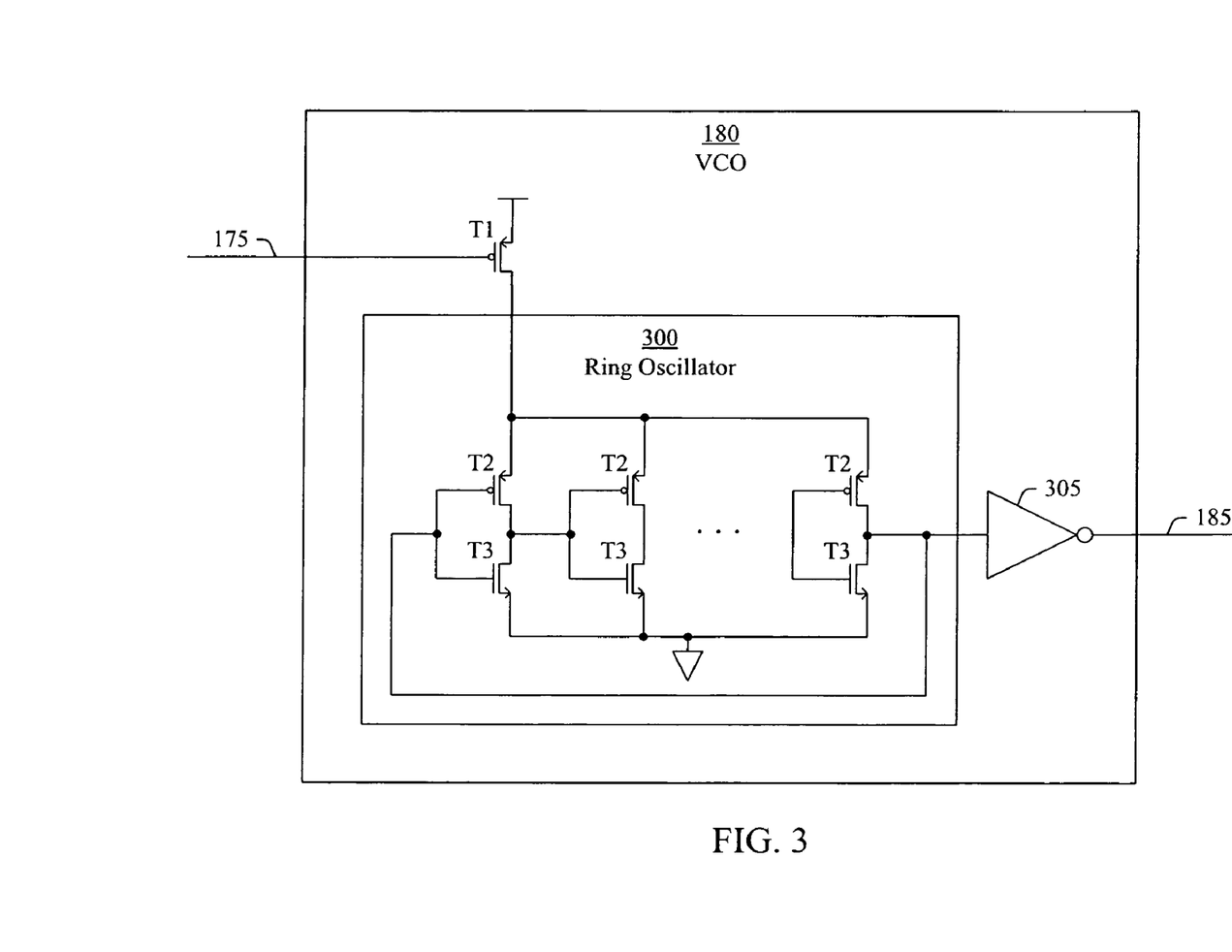
FIG. 3 is a schematic diagram of voltage-controlled oscillator, in accordance with an embodiment of the present invention.

FIG. 3 illustrates the voltage-controlled oscillator 180, in accordance with an embodiment of the present invention. The voltage-controlled oscillator 180 includes a transistor T1, a ring oscillator 300, and a buffer 305. Although the transistor T1 illustrated in FIG. 3 is a P-type transistor, the transistor T1 may be another type of transistor, such as an N-type metaloxide semiconductor (NMOS) transistor, in other embodiments. A source of the transistor T1 is connected to a supply voltage (e.g., Vcc) and a gate of the transistor T1 receives the signal 175 from the low-pass filter 170. A drain of the transistor T1 is connected to the ring oscillator 300. The ring oscillator 300 includes an odd number (e.g., a prime number) of inverters arranged in a ring and generates an output signal having a frequency based on propagation delays of the inverters in the ring.

Each of the inventors in the ring oscillator 300 includes a transistor T2 and a corresponding transistor T3. As illustrated in FIG. 3, the transistor T2 is a P-type transistor and the transistor T3 is an N-type transistor. The source of the transistor T2 is connected to the drain of the transistor T1, the drain of the transistor T2 is connected to the drain of the corresponding transistor T3, and the source of the corresponding transistor T3 is connected to a ground potential. Additionally, the drains of the transistor T2 and the transistor T3 in each inverter are connected to the gates of the transistor T2 and the transistor T3 in the following inverter of the ring. Each of the transistors T2 and T3 in an inverter has a threshold voltage that may vary with process, voltage, or temperature variation of an integrated circuit containing the phase-lock loop 105. Moreover, the propagation delay of each inverter in the ring oscillator 300 depends upon the threshold voltages of the transistors T2 and T3 in that inverter.

The buffer 305 includes an input connected to the output the ring oscillator 300. As illustrated, the input of the buffer 305 is connected to the drains of the transistors T2 and T3 in one of the inverters of the ring oscillator 300. In operation, the buffer 305 generates the output clock signal 185 having a frequency based on the propagation delay of a signal propagating around the ring of the ring oscillator 300. Although the buffer 305 illustrated in FIG. 3 is an inverting buffer, the buffer 305 may be a non-inverting buffer in other embodiments.

In operation, the signal 175 controls a current flowing through the transistor T1, which affects the propagation delays of the inverters in the ring oscillator 300. In this way, the signal 175 determines an oscillation frequency of the ring oscillator 300. Because the frequency of the output clock signal 185 is the same as the oscillation frequency of the ring oscillator 300, the signal 175 also determines the frequency of the output clock signal 185. In other embodiments, the voltage-controlled oscillator 180 may have more or fewer components than those illustrated in FIG. 3, which may be connected in various arrangements.

Figure 4:
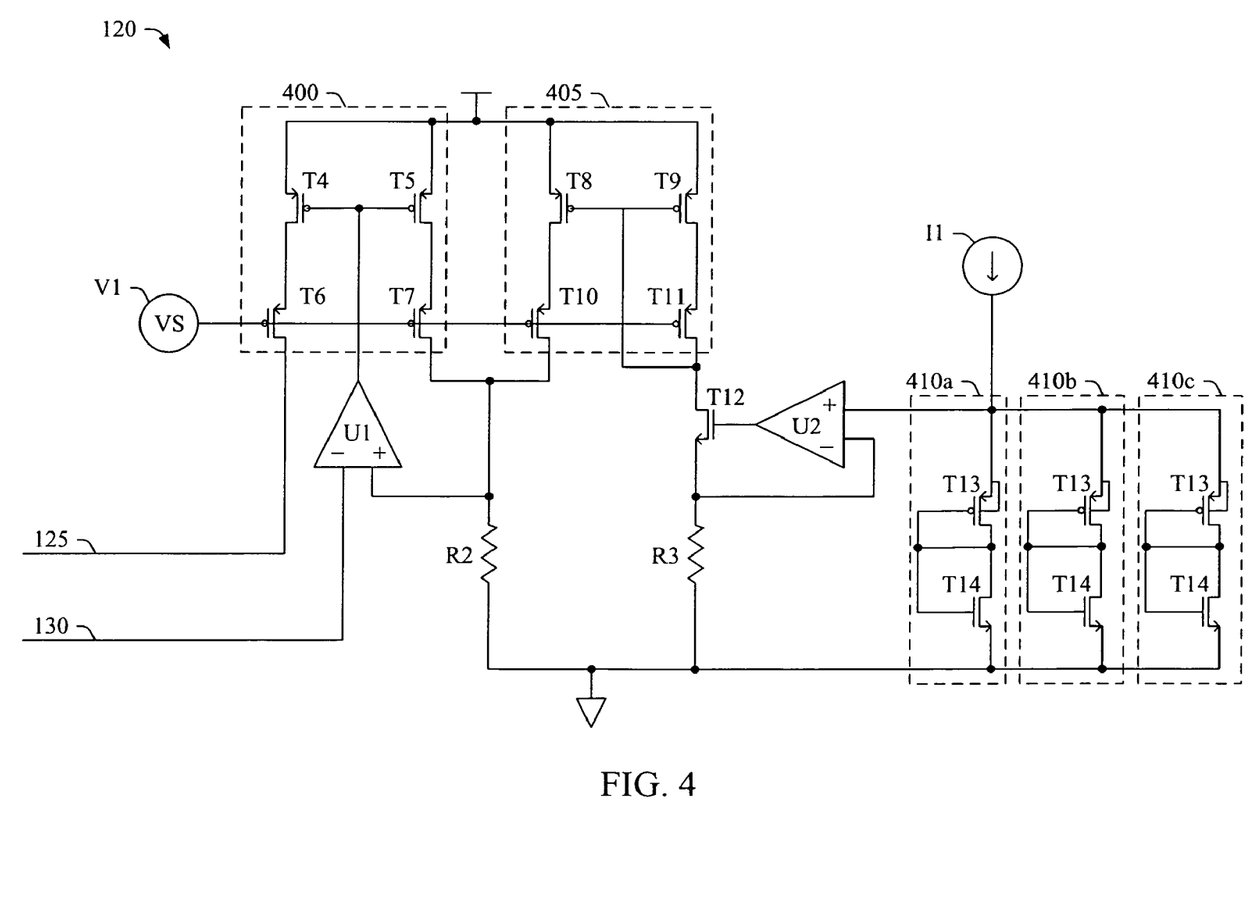
FIG. 4 is a schematic diagram of a self-bias circuit, in accordance with an embodiment of the present invention.

FIG. 4 illustrates the self-bias circuit 120, in accordance with one embodiment of the present invention. The self-bias circuit 120 includes a current mirror 400, a current mirror 405, a voltage source (VS) V1, a current source I1, an operational amplifier U1, an operational amplifier U2, a transistor T12, a resistor R2, a resistor R3, and transistor circuits 410 (e.g., transistor circuits 410a-c). In various embodiments, the resistance of the resistor R2 is substantially the same as the resistance of the resistor R3. Stated differently, the resistors R2 and R3 have a same resistance within a predetermined tolerance (e.g., a one-percent tolerance). Although three transistor circuits 410 are illustrated in FIG. 4, the self-bias circuit 120 may have more or fewer than three transistor circuits 410 in other embodiments.

Each of the transistor circuits 410 is connected to the current source I1, a ground potential, and a positive input (+) of the operational amplifier U2. In operation, the transistor circuit 410 generates a voltage representing one or more threshold voltages of transistors in the transistor circuit 410 and provides the generated voltage to the positive input (+) of the operational amplifier U2.

In one embodiment, the transistor circuit 410 is a transistor stack including a transistor T13 stacked on a transistor T14. In this embodiment, the transistor T13 is a P-type transistor, such as a PMOS transistor, and the transistor T14 is an N-type transistor, such as an NMOS transistor. A gate of the transistor T14 is connected to a drain of the transistor T14, a gate of the transistor T13, and a drain of the transistor T13. A source of the transistor T14 is connected to a ground potential. A source of the transistor T13 is connected to the current source I1 and the positive input of the operational amplifier U2. Additionally, the source of the transistor T13 is connected (e.g., tied) to a substrate of the transistor T13. The transistor circuit 410 generates a voltage at the positive input of the operational amplifier U2 that is equal to a sum of a threshold voltage vtp of the transistor T13 and a threshold voltage vtn of the transistor T14.

The negative input (−) of the operational amplifier U2 is connected to a source of the transistor T12 and one end of the resistor R3. The other end of the resistor R3 is connected to a ground potential. An output of the operational amplifier U2 is connected to a gate of the transistor T12 and functions to generate a voltage at the drain of the transistor T12 that is substantially equal to the sum of the threshold voltage vtp of the transistor T13 and the threshold voltage vtn of the transistor T14. Moreover, the operational amplifier U2 functions to generate a current at the drain of the transistor T12 that is substantially equal to the sum of the threshold voltage vtp of the transistor T13 and the threshold voltage vtn of the transistor T14 divided by the resistance of the resistor R3.

The current mirror 405 includes transistors T8, T9, T10, and T11. Each of the transistors T8, T9, T10, and T11 is a P-type transistor, such as a PMOS transistor. In other embodiments, one or more of the transistors T8, T9, T10, or T11 may be another type of transistor, such as an N-type transistor. The source of the transistor T8 and the source of the transistor T9 are connected to a supply voltage (e.g., Vcc). The gates of the transistors T8 and T9 are connected to the drains of the transistors T11 and T12. The drain of the transistor T9 is connected to the source of the transistor T11 and the drain of the transistor T8 is connected to the source of the transistor T10. Additionally, the voltage source V1 is connected to the gates of the transistors T10 and T11. The sizes (e.g., gate lengths and gate widths) of the transistors T8, T9, T10, and T11 in the current mirror 405 are selected so that the current mirror 405 generates a current at the drain of the transistor T10 that is substantially half the current at the drain of the transistor T11. For example, the size of the transistor T9 may be selected to be twice the size of the transistor T8 and the size of the transistor T11 may be selected to be twice the size of the transistor T10. Thus, the current at the drain of the transistor T10 is half the sum of the threshold voltage vtp of the transistor T13 and the threshold voltage vtn of the transistor T14 divided by the resistance of the resistor R3.

The current mirror 400 includes transistors T4, T5, T6, and T7. Each of the transistors T4, T5, T6, and T7 is a P-type transistor, such as a PMOS transistor. In other embodiments, one or more of the transistors T4, T5, T6, or T7 may be another type of transistor, such as an N-type transistor. A source of the transistor T4 and a source of the transistor T5 are connected to a supply voltage (e.g. Vcc). A drain of the transistor T5 is connected to a source of the transistor T7 and a drain of the transistor T4 is connected to a source of the transistor T6. The voltage source V1 is connected to a gate of the transistor T6 and a gate of the transistor T7. Additionally, one end of the resistor R2 is connected to a ground potential and the other end of the resistor R2 is connected to a positive input (+) of the operational amplifier U1, the drain of the transistor T7, and the drain of the transistor T10.

A negative input (−) of the operational amplifier U1 is connected to the bias voltage 130 generated by the low-pass filter 170. An output of the operational amplifier U1 is connected to a gate of the transistor T4 and a gate of the transistor. The operational amplifier U1 functions to establish a voltage at the drain of the transistor T7 that is substantially the same as the bias voltage 130. Thus, the current through the resistor R2 is substantially the same as the bias voltage 130 divided by a resistance of the resistor R2. In turn, the current at the drain of the transistor T7 is the current through the resistor R2 minus the current at the drain of the transistor T10. Thus, the current at the drain of the transistor T7 is substantially equal to the bias voltage 130 minus half the sum of the threshold voltage vtp of the transistor T17 and the threshold voltage vtn of the transistor T18.

The sizes of the transistors T4, T5, T6, and T7 in the current mirror 400 are selected so that the current mirror 405 generates the charge current 125 at the drain of the transistor T6 that substantially equal to the current at the drain of the transistor T7 multiplied by a constant α. For example, the size of the transistor T4 may be equal to the size of the transistor T5 multiplied by the constant α and the size of the transistor T6 may be equal of the size of the transistor T7 multiplied by the constant α. Moreover, the charge current 125 generated at the drain of the transistor T6 may be expressed by Equation 1 as follows, where Icp is the charge current 125, vc is the bias voltage 130, vtn is the threshold voltage of the transistor T13, vtp is the threshold voltage of the transistor T14, and R' is the resistance of each of the resistors R2 and R3.

$$Icp = \alpha * \frac{vc - \left(\frac{vtn + vtp}{2}\right)}{R'} \quad \text{(Equation 1)}$$

In Equation 1, half the sum of the threshold voltage vtp of the transistor T13 and the threshold voltage vtn of the transistor T14 represents an average threshold voltage of the transistors T13 and T14. Thus, the charge current 125 may be expressed by Equation 2 as follows, where Icp is the charge current 125, vc is the bias voltage 130, vth is the average threshold voltage of the transistors T13 and T14, and R' is the resistance of each of the resistors R2 and R3.

$$Icp = \alpha * \frac{vc - vth}{R'} \quad \text{(Equation 2)}$$

An open-loop transfer function H(s) of the phase-lock loop 105 may be expressed by Equation 3 as follows, where Icp is the charge current 125, R represents a resistance of the resistor R1, C represents a capacitance of the capacitor C1, C' represents a capacitance of the capacitor C2, Kvco is the gain of the voltage-controlled oscillator 180, and N is a divisor of the frequency divider 195.

$$H(S) = \frac{Icp}{2*\Pi} * \frac{1 + R*C*S}{S*(C+C')*\left(1 + \frac{R1*C*C'}{C+C'}*S\right)} * \frac{Kvco}{S*N} \quad \text{(Equation 3)}$$

The open-loop unity-gain bandwidth of the phase-lock loop 105 may be modeled by using a continuous-time model approximation. Using the continuous-time model approximation, the open-loop unity-gain of the phase-lock loop 105 may be expressed by Equation 4 as follows, where $F_{UG}$ is the open-loop unity-gain of the phase-lock loop 105, Icp is the charge current 125, R is a resistance of resistor R1, Kvco is a gain of the voltage-controlled oscillator 180, and N is a divisor of the frequency divider 195.

$$F_{UG} = \frac{Icp * R * Kvco}{2 * \Pi * N} \quad \text{(Equation 4)}$$

As indicated in Equation 4, the open-loop unity-gain of the phase-lock loop 105 depends upon the charge current 125, the resistance of the resistor R1, the gain of the voltage-controlled oscillator 180, and the divisor of the frequency divider 195. Consequently, the open-loop unity-gain bandwidth of the phase-lock loop 105 will vary with variations of the charge current 125, the resistance of the resistor R1, the gain of the voltage-controlled oscillator 180, and the divisor of the frequency divider 195.

In embodiments of the present invention, the frequency of the output clock signal 185 is selected based on Equation 5 as follows, where fout is the frequency of the output clock signal 185, Kvco is a gain of the voltage-controlled oscillator 180, vc is the bias voltage 130 generated by the capacitor C1 of the low-pass filter 170, and vth is an average threshold voltage of the transistors T13 and T14 in the transistor circuit 410.

$$fout = Kvco*(vc-vth) \quad \text{(Equation 5)}$$

As indicated by Equation 5, the frequency of the output clock signal 185 is a product of the gain of the voltage-controlled oscillator 180 and a difference of the bias voltage 130 on the capacitor C1 and the average threshold voltage of the transistors T13 and T14. To achieve this result, the self-bias circuit 120 generates the charge current 125 based on the resistance of the resistor R1 in the low-pass filter 170, the bias voltage 130, and the average threshold voltage of the transistors T13 and T14 in the transistor circuit 410, as indicated by Equation 2. In some embodiments, the transistor T13 in the transistor circuit 410 is substantially similar to the transistor T2 in the ring oscillator 300 and the transistor T14 in the transistor circuit 410 is substantially similar to the transistor T3 in the ring oscillator 300. For example, the transistors T13 and T2 may be P-type transistor having the same size and the transistors T14 and T3 may be N-type transistors having the same size. In this way, the self-bias circuit 120 compensates for process, voltage, or temperature variation in an integrated circuit containing the phase-lock loop 105.

The ratio of the resistance of the resistor R1 to the resistance R' in Equation 5 is substantially constant and may be expressed by Equation 6 as follows, where β is a constant, R is the resistance of resistor R1, and R' is the resistance of each of the resistors R2 and R3.

$$\beta = \frac{R}{R'} \quad \text{(Equation 6)}$$

In the phase-lock loop 105, the frequency of the output clock signal 185 is a multiple of a frequency of the reference clock signal 145 and may be expressed by Equation 7 as follows, where fout is the frequency of the output clock signal 185, f_ref is the frequency of the reference clock signal 145, and N is the divisor of the frequency divider 195.

$$f\text{out} = N * f\_\text{ref} \qquad \text{(Equation 7)}$$

By substituting Equation 2, Equation 5, Equation 6, and Equation 7 into Equation 4, the open-loop unity-gain bandwidth of the phase-lock loop 105 may be expressed by Equation 8 as follows, where $F_{UG}$ is the open-loop unity-gain of the phase-lock loop 105, α and β are constants, and f_ref is the frequency of the reference clock signal 145.

$$F_{UG} = \frac{\alpha * \beta}{2 * \Pi} * f\_\text{ref} \qquad \text{(Equation 8)}$$

As indicated by Equation 8, the open-loop unity-gain of the phase-lock loop 105 depends upon the frequency of the reference clock signal 145 as well as the constants α and β, but does not depend upon the divisor of the frequency divider 195.

In some embodiments, α and β may vary slightly during operation of the phase-lock loop 105 because components of the self-bias circuit 120 may have different performance characteristics. For example, a transfer characteristic of a resistor (e.g., resistor R2 or R3) in the self-bias circuit 120 may differ from a transfer characteristic of a current mirror (e.g., current mirror 400 or 405) in the self-bias circuit 120. Generally, α and β are substantially constant and may be approximated as constants in Equation 8. In various embodiments, the self-bias circuit 120 controls the open-loop unity-gain of the phase-lock loop 105 such that the open-loop unity-gain bandwidth of the phase-lock loop 105 does not vary by more than ten percent.

Figure 5:
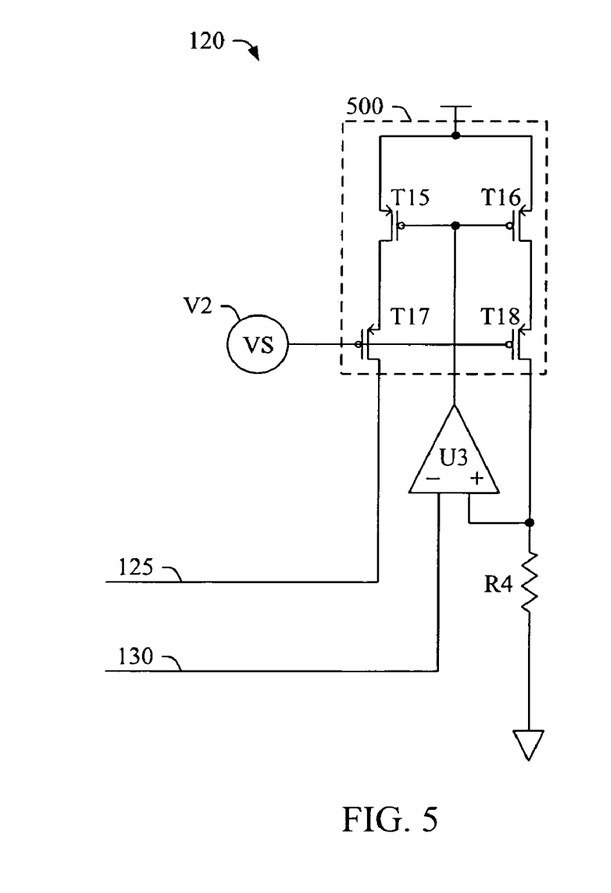
FIG. 5 is a schematic diagram of a self-bias circuit, in accordance with an embodiment of the present invention.

FIG. 5 illustrates the self-bias circuit 120, in accordance with an embodiment of the present invention. The self-bias circuit 120 includes a current mirror 500, a voltage source V2, an operational amplifier U3, and a resistor R4. The current mirror 500 includes transistors T15, T16, T17, and T18. Each of the transistors T15, T16, T17, and T18 is a P-type transistor, such as a PMOS transistor. In other embodiments, some or all of the transistors T15, T16, T17, and T18 may be another type of transistor, such as an N-type transistor. A source of the transistor T15 and a source of the transistor T16 are connected to a supply voltage (e.g., Vcc). A drain of the transistor T15 is connected to a source of the transistor T17 and a drain of the transistor T16 is connected to a source of the transistor T18. Additionally, the voltage source V2 is connected to a gate of the transistor T17 and a gate of the transistor T18.

One end of the resistor R4 is connected to a ground potential. The other end of the resistor R4 is connected to a positive input (+) of the operational amplifier U3 and a drain of the transistor T18. The bias voltage 130 is connected to a negative input (−) of the operational amplifier U3. An output of the operational amplifier U3 is connected to a gate of the transistor T15 and a gate of the transistor T16. The operational amplifier U3 functions to establish a voltage at the drain of the transistor T18 that is substantially the same as the bias voltage 130. Consequently, the current flowing through the resistor R4 is substantially equal to the bias voltage 130 divided by a resistance of the resistor R4.

The sizes of the transistors T15, T16, T17, and T18 in the current mirror 500 are selected so that the current mirror 500 generates the charge current 125 at the drain of the transistor T17 that is substantially equal to the current at the drain of the transistor T18 multiplied by a constant α. For example, the size of the transistor T15 may be equal to the size of the transistor T16 multiplied by the constant α and the size of the transistor T17 may be equal of the size of the transistor T18 multiplied by the constant α. The charge current 125 generated at the drain of the transistor T17 may be expressed by Equation 9 as follows, where Icp is the charge current 125, vc is the bias voltage 130, and R' is the resistance of the resistor R4.

$$Icp = \alpha * \frac{vc}{R'} \qquad \text{(Equation 9)}$$

By substituting Equation 5, Equation 6, Equation 7, and Equation 9 into Equation 4, the open-loop unity-gain of the phase-lock loop 105 may be expressed by Equation 10 as follows, where $F_{UG}$ is the open-loop unity-gain of the phase-lock loop 105, α and β are constants, vc is the bias voltage 130, vth represents a threshold voltage of a transistor in the self-bias circuit 120, and f_ref is the frequency of the reference clock signal 145.

$$F_{UG} = \frac{\alpha * \beta}{2 * \Pi} * \frac{vc}{vc - vth} * f\_\text{ref} \qquad \text{(Equation 10)}$$

As indicated by Equation 10, the open-loop unity-gain of the phase-lock loop 105 depends upon the constants α and β, the bias voltage 130, a threshold voltage of a transistor in the self-bias circuit 120, and the frequency of the reference clock signal 145, but does depends on the divisor of the frequency divider 195.

In some embodiments, one or more of the transistors T15, T16, T17, or T19 in the current mirror 500 is substantially similar to one or more of the transistors T2 or T3 in the ring oscillator 300. For example, the transistors T18 and T3 may be P-type transistors having the same size. In this way, the self-bias circuit 120 compensates for process, voltage, or temperature variation in an integrated circuit containing the phase-lock loop 105.

In some embodiments, α and β may vary slightly during operation of the phase-lock loop 105 because components of the self-bias circuit 120 may have different performance characteristics. For example, a transfer characteristic of the resistor R4 in the self-bias circuit 120 may differ from a transfer characteristic of the current mirror 500 in the self-bias circuit 120. Generally, α and β are substantially constant and may be approximated as constants in Equation 10. In various embodiments, the self-bias circuit 120 controls the open-loop unity-gain of the phase-lock loop 105 such that the open-loop unity-gain bandwidth of the phase-lock loop 105 does not vary by more than twenty percent.

Figure 6:
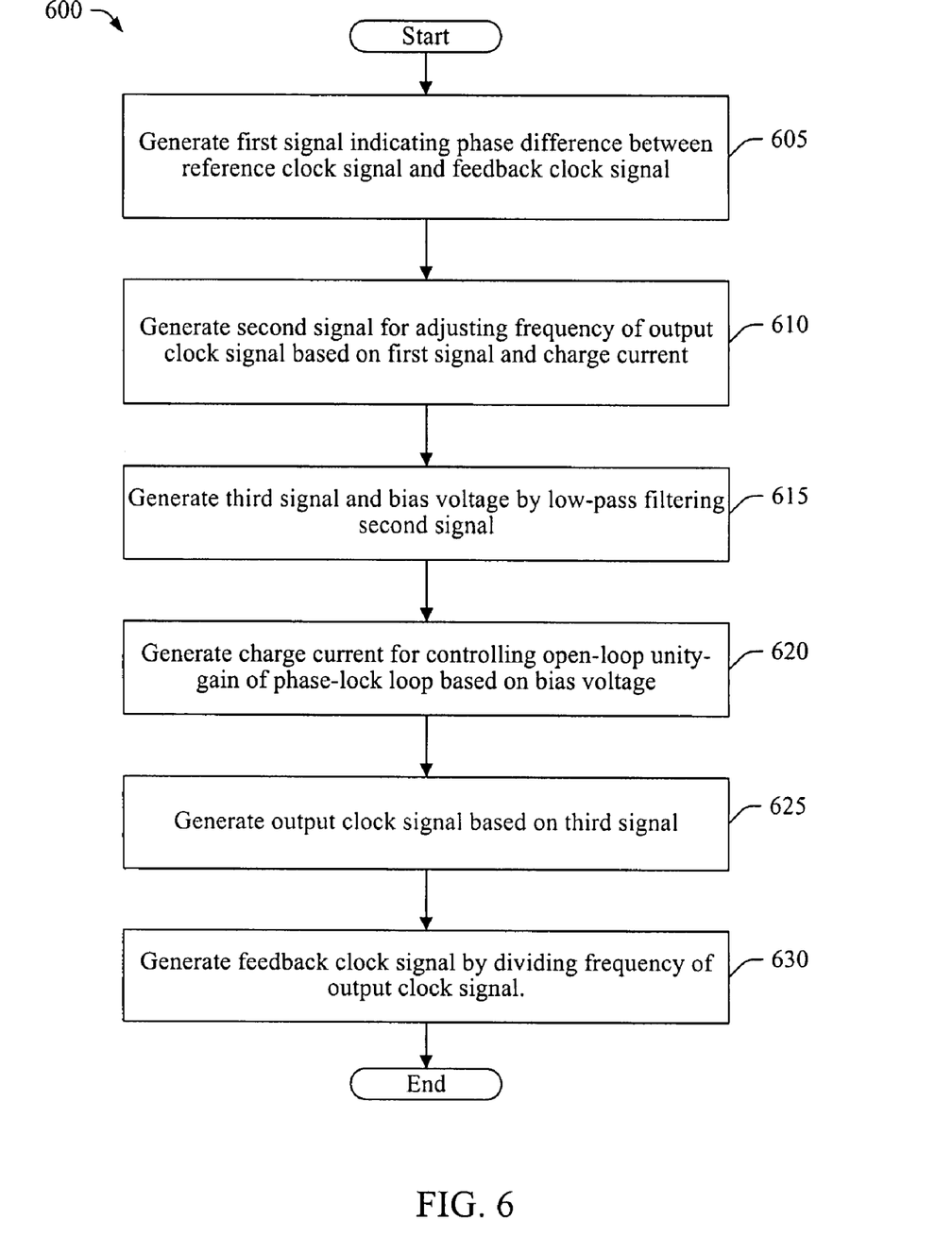
FIG. 6 is a flow chart for a method of generating a clock signal, in accordance with an embodiment of the present invention.

FIG. 6 illustrates a method 600 of generating a clock signal, in accordance with an embodiment of the present invention. In step 605, a first signal is generated indicating a phase-difference between a reference clock signal and a feedback clock signal in a phase-lock loop. In various embodiments, the phase-frequency detector 150 generates the signal 155 (e.g., the first signal) based on the reference clock signal 145 and the feedback clock signal 190. The method 600 then proceeds to step 610.

In step 610, a second signal is generated for adjusting the frequency of an output clock signal. In various embodiments, the charge pump 160 generates the signal 165 (e.g., the second signal) for adjusting the frequency of the output clock signal 185 based on the signal 155 and the charge current 125. The method 600 then proceeds to step 615.

In step 615, a third signal and a bias voltage are generated by low-pass filtering the second signal. In various embodiments, the low-pass filter 170 generates the signal 175 (e.g., the third signal) and the bias voltage 130 by filtering out higher frequency components of the signal 165 and passing lower frequency components of the signal 165. The method 600 then proceeds to step 620.

In step 620, the charge current is generated for controlling an open-loop unity-gain of the phase-lock loop. In various embodiments, the self-bias circuit 120 generates the charge current 125 for controlling the open-loop unity-gain of the phase-lock loop 105 based on the bias voltage 130. The method 600 then proceeds to step 625.

In step 625, the output clock signal is generated based on the third signal. In various embodiments, the voltage-controlled oscillator 180 generates the output clock signal 185 based on the signal 175 (e.g., the third signal). The method 600 then proceeds to step 630.

In step 630, the feedback clock signal is generated by dividing the frequency of the output clock signal. In various embodiments, the frequency divider 195 generates the feedback clock signal 190 by dividing the frequency of the output clock signal 185 by a divisor. The method 600 then ends.

In various embodiments, some or all of the steps 605-630 in the method 600 described above and illustrated in FIG. 6 may be performed in parallel with each other or substantially simultaneously. In some embodiments, the method 600 may include more or fewer than steps 605-630. In some embodiments, the steps 605-630 of the method 600 may be performed in a different order than the order described above and illustrated in FIG. 6.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A clock generator comprising a phase-lock loop configured to generate an output clock signal based on a reference clock signal, the phase-lock loop comprising:
    a charge pump configured to generate a first signal for adjusting a frequency of the phase-lock loop based on a charge current;
    a low-pass filter coupled to the charge pump, the low-pass filter configured to generate a second signal and a bias voltage by filtering the first signal;
    a voltage-controlled oscillator coupled to the low pass filter and configured to generate the output clock signal having a frequency based on the second signal; and
    a self-bias circuit coupled to the low pass filter and coupled to the charge pump, the self-bias circuit configured to generate the charge current based on the bias voltage for controlling a bandwidth of the phase-lock loop, the self-bias circuit comprising:
        a transistor circuit comprising a plurality of transistors configured to generate a first voltage;
        a first resistor configured to generate a first current based on the first voltage;
        a first current mirror configured to generate a second current based on the first current;
        a second resistor configured to generate a third current comprising the second current and a fourth current; and
        a second current mirror configured to generate the charge current based on the fourth current and the bias voltage.

2. The clock generator of claim 1, wherein the low-pass filter comprises a capacitor configured to generate the bias voltage.

3. The clock generator of claim 1, wherein a resistance of the first resistor is substantially the same as a resistance of the second resistor.

4. The clock generator of claim 1, wherein the at least one transistor circuit comprises at least one transistor stack comprising an N-type transistor and a P-type transistor.

5. The clock generator of claim 4, wherein the first voltage comprises a threshold voltage of the N-type transistor in the at least one transistor stack and a threshold voltage of the P-type transistor in the at least one transistor stack.

6. The clock generator of claim 5, wherein the N-type transistor in the transistor circuit is substantially similar to an N-type transistor in the voltage-controlled oscillator and the P-type transistor in the transistor circuit is substantially similar to a P-type transistor in the voltage-controlled oscillator.

7. An integrated circuit comprising a phase-lock loop, the phase-lock loop comprising:
    a phase-frequency detector configured to generate a first signal indicating a phase difference between a reference clock signal and a feedback clock signal;
    a charge pump coupled to the phase-frequency detector, the charge pump configured to generate a second signal for adjusting a frequency of an output clock signal based on the first signal and a charge current;
    a low-pass filter coupled to the charge pump, the low pass filter configured to generate a third signal and a bias voltage by filtering the second signal;
    a self-bias circuit coupled to the low-pass filter and coupled to the charge pump, the self-bias circuit configured to generate the charge current for controlling a bandwidth of the phase-lock loop based on the bias voltage, the self-bias circuit comprising:
        a first operational amplifier configured to generate a first voltage based on the bias voltage;
        a first resistor coupled to the first operational amplifier and configured to generate a first current based on the first voltage;
        a first current mirror coupled to the first resistor and configured to generate the charge current based on the first current;
        a second resistor;
        a transistor circuit comprising a plurality of transistors configured to generate a second voltage;
        a second operational amplifier coupled to the second resistor and the transistor circuit, the second operational amplifier in combination with the second resistor configured to generate a second current; and
        a second current mirror coupled to the first resistor and the second resistor, the second current mirror configured to generate a third current based on the second current, wherein the first resistor is further configured to generate a fourth current comprising the first current and the third current;
    a voltage-controlled oscillator coupled to the low-pass filter, the voltage-controlled oscillator configured to generate the output clock signal based on the third signal; and
    a frequency divider coupled to the output of the voltage-controlled oscillator and coupled to the phase-frequency detector, the frequency divider configured to generate the feedback clock signal by dividing the frequency of the output clock signal.

8. The integrated circuit of claim 7, wherein the self-bias circuit is further configured to generate the charge current to compensate for process, voltage, or temperature variation in the integrated circuit.

9. The integrated circuit of claim 7, wherein the low-pass filter comprises a capacitor configured to generate the bias voltage.

10. The integrated circuit of claim 7, wherein the transistor circuit comprises at least one transistor stack comprising an N-type transistor and a P-type transistor.

11. The integrated circuit of claim 10, wherein a resistance of the first resistor is substantially the same as a resistance of the second resistor.

12. The integrated circuit of claim 11, wherein the second voltage comprises a threshold voltage of the N-type transistor in the at least one transistor stack and a threshold voltage of the P-type transistor in the at least one transistor stack.

13. The integrated circuit of claim 12, wherein the N-type transistor in the transistor circuit is substantially similar to an N-type transistor in the voltage-controlled oscillator and the P-type transistor in the transistor circuit is substantially similar to a P-type transistor in the voltage-controlled oscillator.

14. The integrated circuit of claim 7, further comprising a reference clock generator configured to generate the reference clock signal.

15. The integrated circuit of claim 7, further comprising a transistor coupled to the second resistor and the second operational amplifier, the transistor in combination with the second resistor and the second operational amplifier configured to generate the second current.

16. A method for generating a clock signal by using a phase-lock loop, the method comprising:
  generating a first signal indicating a phase difference between a reference clock signal and a feedback clock signal;
  generating a second signal for adjusting a frequency of an output clock signal based on the first signal and a charge current;
  generating a third signal and a bias voltage by low-pass filtering the second signal;
  generating the charge current for controlling a bandwidth of the phase-lock loop based on the bias voltage;
  generating the output clock signal based on the third signal; and
  generating the feedback clock signal by dividing the frequency of the output clock signal, wherein the phase-lock loop includes an N-type transistor and a P-type transistor, and wherein generating the charge current comprises generating a voltage based on a threshold voltage of the N-type transistor and a threshold voltage of the P-type transistor.

17. The method of claim 16, wherein the phase-lock loop is embodied in an integrated circuit, and wherein generating the charge current compensates for process, voltage, or temperature variation in the integrated circuit.

18. The method of claim 16, wherein the phase-lock loop includes a ring oscillator comprising the N-type transistor and the P-type transistor.

* * * * *

UNITED STATES PATENT AND TRADEMARK OFFICE
CERTIFICATE OF CORRECTION

| | |
|---|---|
| PATENT NO. | : 7,586,347 B1 |
| APPLICATION NO. | : 11/862653 |
| DATED | : September 8, 2009 |
| INVENTOR(S) | : Ren et al. |

It is certified that error appears in the above-identified patent and that said Letters Patent is hereby corrected as shown below:

Column 5, line 11 the word "inventors" should read --inverters--.

Column 12, line 10 the phrase "at least one transistor circuit" should read --transistor circuit--.

Signed and Sealed this

Thirteenth Day of April, 2010

David J. Kappos
*Director of the United States Patent and Trademark Office*